United States Patent
Blon

(10) Patent No.: US 7,414,467 B2
(45) Date of Patent: Aug. 19, 2008

(54) CIRCUIT CONFIGURATION HAVING A FEEDBACK, FULLY-DIFFERENTIAL OPERATIONAL AMPLIFIER

(75) Inventor: Thomas Blon, Jengen (DE)

(73) Assignee: National Semiconductor Germany AG, Unterhaching (DE)

( * ) Notice: Subject to any disclaimer, the term of this patent is extended or adjusted under 35 U.S.C. 154(b) by 118 days.

(21) Appl. No.: 11/599,772

(22) Filed: Nov. 15, 2006

(65) Prior Publication Data

US 2007/0115050 A1    May 24, 2007

(30) Foreign Application Priority Data

Nov. 21, 2005    (DE) ................ 10 2005 055 426

(51) Int. Cl.
    *H03F 3/45*    (2006.01)
(52) U.S. Cl. ........................... 330/69; 330/260
(58) Field of Classification Search .......... 330/69, 330/75, 252, 260
    See application file for complete search history.

(56) References Cited

U.S. PATENT DOCUMENTS 5,382,919 A    1/1995    Lawton 6,304,144 B1    10/2001    Yamazaki et al.
6,545,534 B1*    4/2003    Mehr ..................... 330/69
6,621,337 B2*    9/2003    Gropl .................... 330/69
6,940,348 B2*    9/2005    Confalonieri et al. ...... 330/69

FOREIGN PATENT DOCUMENTS

DE    43 36 668 A1    5/1994

* cited by examiner

*Primary Examiner*—Henry K Choe
(74) *Attorney, Agent, or Firm*—Pearne & Gordon LLP

(57) ABSTRACT

The present invention relates to a circuit configuration having a feedback operational amplifier (AMP), which is implemented as fully differential, for amplifying an input signal differentially input to the circuit configuration and for outputting the amplified input signal as a differential output signal. In order to increase the freedom in setting the input common mode voltage, according to the present invention, a combination made of a coupling resistor (R1b) and a level shifter (I1b, Nsfb) connecting the positive amplifier output (y1) to the inverting amplifier input (x2) and a combination made of a coupling resistor (R1a) and a level shifter (I1a, Nsfa) connecting the negative amplifier output (y2) to the noninverting amplifier input (x1) are provided.

13 Claims, 1 Drawing Sheet

CIRCUIT CONFIGURATION HAVING A FEEDBACK, FULLY-DIFFERENTIAL OPERATIONAL AMPLIFIER

BACKGROUND OF THE INVENTION

1. Area of the Invention

The present invention relates to a circuit configuration having a feedback operational amplifier, implemented as fully differential, for amplifying an input signal input differentially into the circuit configuration and outputting the amplified input signal as a differential output signal.

The term "operational amplifier" as defined in the present invention is to be understood very broadly as a configuration capable of amplifying an electrical variable such as a voltage. In particular, it refers to amplifiers, for example, in which a signal applied to the amplifier input is provided having relatively high voltage amplification at the amplifier output. This open amplification ("open loop again") may be in the magnitude of approximately $10^4$ through $10^5$, for example.

An essential characteristic of the circuit configuration according to the species is that the circuit amplification, i.e., the ratio between output signal and input signal, is practically completely independent of this open amplification (except for transient occurrences) and is solely predefined by an additional (external) configuration or a "feedback network" of the operational amplifier. The feedback network is formed in the circuit configuration according to the species from the totality of coupling, feedback, and decoupling paths.

The feedback network determines the resulting circuit amplification. In the simplest case, the feedback network comprises a configuration of one or more (ohmic) resistors. Alternatively or additionally, other components such as capacitors and/or inductors may be provided to produce the feedback network. Very generally, these components provided to produce the feedback network are thus identified in the following as impedances.

2. Description of the Prior Art

The fully differential implementation of the operational amplifier, which is advantageous for many applications, means that the difference of the potentials applied to the two amplifier inputs (amplifier input voltage) is provided amplified by the open amplification at the two amplifier outputs as the amplifier output voltage, no galvanic coupling between the amplifier inputs and the amplifier outputs being performed by the operational amplifier itself. In order to provide defined potential ratios at the output of such an operational amplifier, in practice, the output common mode voltage is typically set to a predefined value. This output common mode voltage, referred to in short in the following as the "output CM", is defined as the mean value of the two voltages provided at the amplifier output (each in relation to a reference potential, e.g., a supply potential). Fully-differential operational amplifiers typically have a CM setting input to be impinged by a setting voltage for setting the output CM to a value which precisely corresponds to this setting voltage applied to the setting input.

If the feedback network provides resistive feedback paths from the amplifier outputs to the amplifier inputs, these feedback paths not only influence the resulting circuit amplification, but rather also influence the input-side potential ratios of the operational amplifier through the galvanic coupling which is thus more or less implemented. In many cases, this is a desired effect (or side effect), for example, to set the input common mode voltage, also referred to in the following in short as the "input CM", to the same value as the output CM. This is true in particular if the input CM was not yet defined using the input-side circuitry of the operational amplifier alone. In this context, it is to be noted that for some operational amplifier circuits, both the input CM and also the output CM are to each be kept reliably in a specific range to ensure perfect function of the operational amplifier. These ranges are at least within the range predefined by two supply potentials of the operational amplifier. For the output CM, it is additionally favorable in regard to a large control range of the operational amplifier if it is approximately in the middle of the range predefined by the two supply potentials. In this case, it is disadvantageous under certain circumstances, however, if the output CM at approximately half of the supply voltage causes an equally large input CM via resistive feedback paths.

OUTLINE OF THE INVENTION

It is therefore an object of the present invention to increase the freedom in setting the input CM in a circuit configuration of the type cited at the beginning.

This object is achieved according to the present invention by a combination made of a coupling resistor and a level shifter which connects the positive amplifier output to the inverting amplifier input as well as a combination made of a coupling resistor and a level shifter which connects the negative amplifier output to the noninverting amplifier input.

The level shifter thus connected between an amplifier output and a coupling resistor has the object of applying the potential existing at the amplifier output to the coupling resistor shifted by a predetermined amount.

Through the measures according to the present invention, the input CM may advantageously be predefined differently from the output CM. In many applications, this represents a significant advantage.

The circuit configuration according to the present invention may particularly be provided as a functional block of an integrated circuit configuration, in particular an integrated circuit configuration manufactured in CMOS technology.

The influencing of the input-side potential ratios on the basis of the output CM achieved by the present invention is particularly very advantageous if at least one part of the coupling paths are formed by impedances having a capacitive component, in particular if the coupling paths are of a purely capacitive type and the input-side potential ratios, particularly the input CM, would be defined rather poorly or not at all without the measures according to the present invention.

Coupling paths of a purely capacitive type may be formed, for example, by a first capacitor, which connects a first circuit input to the noninverting amplifier input, and by a second capacitor, which connects the second circuit input to the inverting amplifier input.

Furthermore, at least a part of the feedback paths may be formed by impedances having a capacitive component, in particular, feedback paths which comprise a first capacitor and a second capacitor may also be provided here, the first capacitor connecting the negative amplifier output to the noninverting amplifier input and the second capacitor connecting the positive amplifier output to the inverting amplifier input.

Further coupling paths or decoupling paths may be connected in parallel to each of the coupling paths and/or decoupling paths explained above. Such further coupling paths may be permanent or alternately may be connectable and disconnectable to the feedback network via a switching element such as a transistor. The alternate connection and disconnection may advantageously be used for operational change of the circuit amplification. The combinations according to the present invention, each of which is formed by a coupling resistor and a level shifter according to the present invention, may provide significant advantages in connection with the connection and disconnection of additional coupling paths, as is obvious from the exemplary embodiment described below.

In a preferred embodiment, the coupling resistors are each implemented as ohmic resistors having a resistance value of more than 1 MΩ. Using a comparatively large resistance value of this type, the influence of this coupling resistor on the feedback or the circuit amplification determined thereby may be kept low. This is particularly advantageous if the feedback paths are to be implemented essentially capacitively.

In one embodiment, both the coupling paths and also the feedback paths are implemented essentially capacitively. For example, both two coupling paths, which connect a first circuit input to the noninverting amplifier input and a second circuit input to the inverting amplifier input, and also two feedback paths, which connect the negative amplifier output to the noninverting amplifier input and the positive amplifier output to the inverting amplifier input, may each be formed by a coupling capacitor, one of the combinations provided according to the present invention of a coupling resistor and a level shifter being connected in parallel to each of the two feedback paths.

For a specific operating frequency range (frequency range of the input signal to be amplified), the influence of the coupling resistor on the circuit amplification may be kept negligibly small through suitable selection of the resistance value of the coupling resistor or the capacitances of the coupling resistors.

Using an amplifier which is essentially capacitively coupled both at its input and also in regard to the feedback, in particular signals containing signal components having high frequencies may be amplified (while simultaneously suppressing low-frequency components). In one embodiment, the circuit configuration is used for amplifying input signals and having a frequency or having frequency components which are greater than 1 MHz (e.g., a few tens to 100 MHz). The decoupling paths of the circuit configuration may be formed in the simplest case by direct line connections between the amplifier output and the circuit output, which connect the negative amplifier output to a first circuit output and, in addition, the positive amplifier output to a second circuit output.

The operational amplifier may be configured as an inverting amplifier which is essentially capacitively coupled overall. The present invention particularly provides special advantages if the operational amplifier has a differential input stage of a type known per se (input differential pair, preferably PMOS), since in this case an output CM which corresponds to half of the supply voltage is advantageous, but an equally large input CM would often be unfavorable. This is particularly true for circuit configurations or manufacturing technologies for integrated circuits in which very low supply voltages are provided (e.g., 1.5 V or less).

In a preferred embodiment, the level shifters each comprise a current-carrying resistor element or a, current-carrying transistor.

The current flow is preferably provided using a constant current source. The resistor element may be formed by a powered channel of a field-effect transistor (FET), for example, particularly by an FET channel powered using a constant current source. Such an FET (e.g., MOSFET) may, for example, be incorporated as a source sequencer in the circuit configuration in such a way that its gate is connected to the affected amplifier output, whose source is connected to the coupling resistor and, in addition, to a current source (e.g., constant current source) and whose drain is connected to a predefined reference potential (e.g., a supply potential of the circuit configuration or the operational amplifier).

The two level shifters are preferably constructed identically, so that identical potential shift absolute values are ensured for the two feedback paths in a simple way.

In one embodiment, the operational amplifier has a setting input for setting the output CM.

According to a first variation, in regard to the setting of the output CM, the operational amplifier is connected to a first supply potential and the second supply potential for its supply and the output CM is set as a predetermined fraction of the supply voltage. It is at least favorable for this purpose if the fraction is in the range from 40% to 60%, particularly at least approximately 50%.

According to another variation, the operational amplifier is connected to a first supply potential and a second supply potential for its supply and the output CM is set as the supply voltage reduced by a predetermined reduction voltage. It is at least favorable for this purpose if the reduction voltage is in the range from 40% to 60% of a rated supply voltage of the operational amplifier, particularly at least 50% of the rated supply voltage.

In one embodiment, the coupling paths comprise impedances connectable and disconnectable via one transistor each for changing a circuit amplification. In this case, a special advantage of the present invention may result because through the level shifting of the input CM in relation to the output CM, a potential exists at a transistor terminal connected to the affected amplifier input, which allows turning on (transistor conducts) and turning off (transistor blocks) without problems. If the transistor is an FET, for example, whose source (or drain) is connected to the affected amplifier input and which is switched as conductive and nonconductive through a variation of the gate potential, an unfavorable source potential (or drain potential) may result in this FET itself not being able to be brought into the completely conducting and/or blocking state when the gate potential is varied over the entire supply voltage range. This set of problems is particularly significant for comparatively small supply voltages of the affected circuit configuration. The present invention may provide a remedy here in that the input CM and thus finally the two input-side potentials at the operational amplifier are shifted in a desired direction.

BRIEF DESCRIPTION OF THE DRAWING

The present invention is described further in the following on the basis of exemplary embodiments with reference to the attached drawing.

DESCRIPTION OF THE PREFERRED EMBODIMENTS

Figure 1:
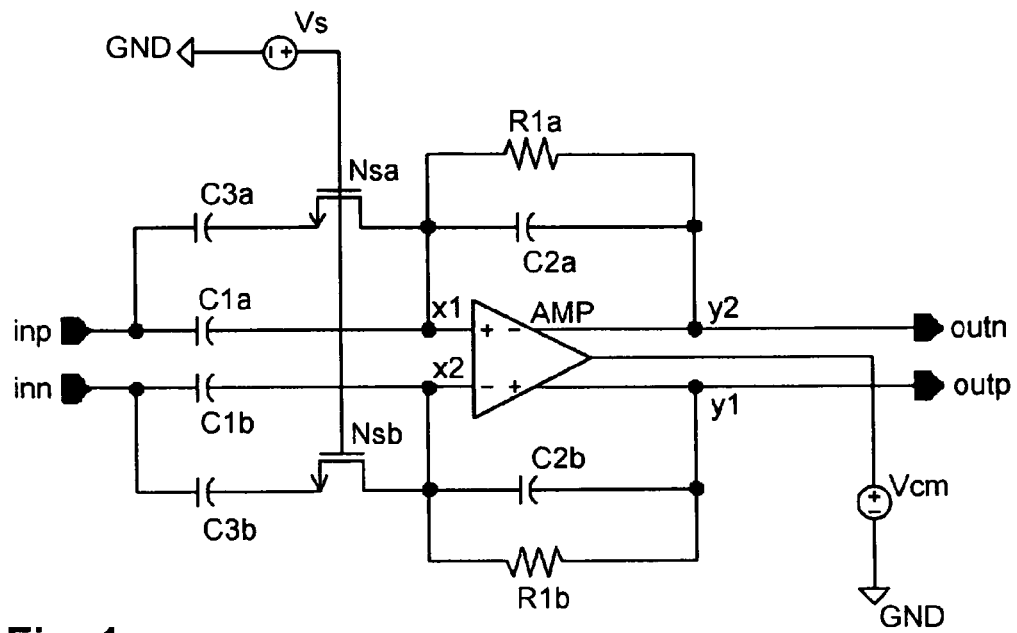
FIG. 1 is a circuit diagram to illustrate a capacitively coupled inverting amplifier according to a typical embodiment.

FIG. 1 shows a circuit configuration implemented as part of a microelectronic integrated circuit for amplifying a high-frequency input signal and for outputting the amplified input signal as an output signal.

The input signal is input as a differential voltage signal at a first circuit input inp and a second circuit input inn and coupled via a first coupling path comprising a capacitor C1$a$ and a second coupling path comprising a capacitor C1$b$ to a noninverting amplifier input or an inverting amplifier input, respectively, of an operational amplifier AMP.

The operational amplifier AMP is implemented as fully differential and accordingly has two amplifier outputs, namely a negative amplifier output, which is connected directly to a first circuit output outn, and a positive amplifier output, which is connected directly to a second circuit output outp.

A feedback path comprising a capacitor C2a is connected between a circuit node y2, which is connected directly to the negative amplifier output, and a circuit node x1, which is connected directly to the noninverting amplifier input. A feedback path comprising a capacitor C2b is connected between a circuit node y1, which is connected directly to the positive amplifier output, and a circuit node x2, which is connected directly to the inverting amplifier input.

The capacitors C1a and C1b, which are dimensioned at identical capacitance, and the capacitors C2a and C2b, which are also dimensioned at identical capacitance, form a symmetrical external circuit (feedback network) of the operational amplifier AMP, which defines the resulting circuit amplification, i.e., the ratio of the output voltage at the circuit output outn, outp to the input voltage at the circuit input inp, inn independently of the open amplification of the amplifier AMP. An input differential pair of the amplifier AMP is preferably implemented in PMOS.

In the exemplary embodiment shown, the circuit amplification may be changed by simultaneously connecting and disconnecting to further coupling paths, each of which comprises a series circuit made of a capacitor and a field effect transistor. The coupling path running from the input inp to the circuit node x1 may be connected via a transistor Nsa and a capacitor C3a, and the coupling path running from the input inn to the circuit node x2 may be connected via a transistor Nsb and a capacitor C3b. The reference sign Vs used in the figure symbolizes the switching voltage supplied in this case for this connection and disconnection to the gate terminals of the transistors Nsa and Nsb, in relation to a first supply potential GND (negative here) of the circuit configuration. For the sake of simplicity of the illustration, the supply of the operational amplifier AMP with this first supply potential GND and a second supply potential vdd is not shown in the figure.

A setting voltage Vcm for setting the output common mode voltage (output CM) of the operational amplifier AMP is also provided in a circuit part in relation to the first supply potential GND and supplied to the operational amplifier AMP at a setting input provided for this purpose. In a way known per se, the output CM of the operational amplifier AMP is thus set to the value Vcm.

The output CM is expediently set to the mean value of the two supply potentials GND and vdd to achieve the greatest possible control range (variation of the output voltage).

The input CM, which at the typically very large open amplification of the operational amplifier AMP practically corresponds to the (nearly identical) potentials at the circuit node x1 and x2, is also to be fixed for perfect functioning of the amplifier AMP. This is achieved in the circuit configuration shown by resistors R1a and R1b, which are each connected in parallel to the feedback paths C2a and C2b. These resistors couple the amplifier output (y1, y2) galvanically to the amplifier input (x1, x2), so that the input CM is equal to the output CM. These resistors are selected having a comparatively high resistance value (e.g., a few MΩ), so that their influence on the feedback characteristic is practically negligible.

The resistors R1a and R1b are used solely for setting the input CM to the value of the output CM. This type of CM setting has two advantages in the circuit configuration shown, however.

Firstly, the input CM, which is at 50% vdd, is unfavorable for the differential input stage typically provided in an operational amplifier.

In addition, a gate source voltage for the MOSFET switches Nsa, Nsb sufficiently large to bring these transistors into the perfectly conducting state may not be achieved under certain circumstances. This set of problems particularly results for comparatively small supply voltages (=vdd−GND) and may result in these switching transistors having a larger or smaller intrinsic resistance (in the conductive state). In addition, this undesired resistance of the source-drain route of the switching transistors Nsa, Nsb varies with a variation of vdd possibly occurring in operation of the circuit configuration and with a manufacturing variation (tolerance) of the usage voltage of the transistors Nsa, Nsb. The transistors Nsa and Nsb thus have an undesired influence, which is additionally difficult to foresee, on the coupling characteristic and thus the resulting circuit amplification.

The problems described above of the circuit configuration from FIG. 1 may be corrected by a modification described in the following with reference to FIG. 2.

In the following description of an exemplary embodiment of the present invention, identical reference signs are used for identically acting components. Essentially only the differences to the embodiment described above are discussed and otherwise reference is expressly hereby made to the preceding description.

Figure 2:
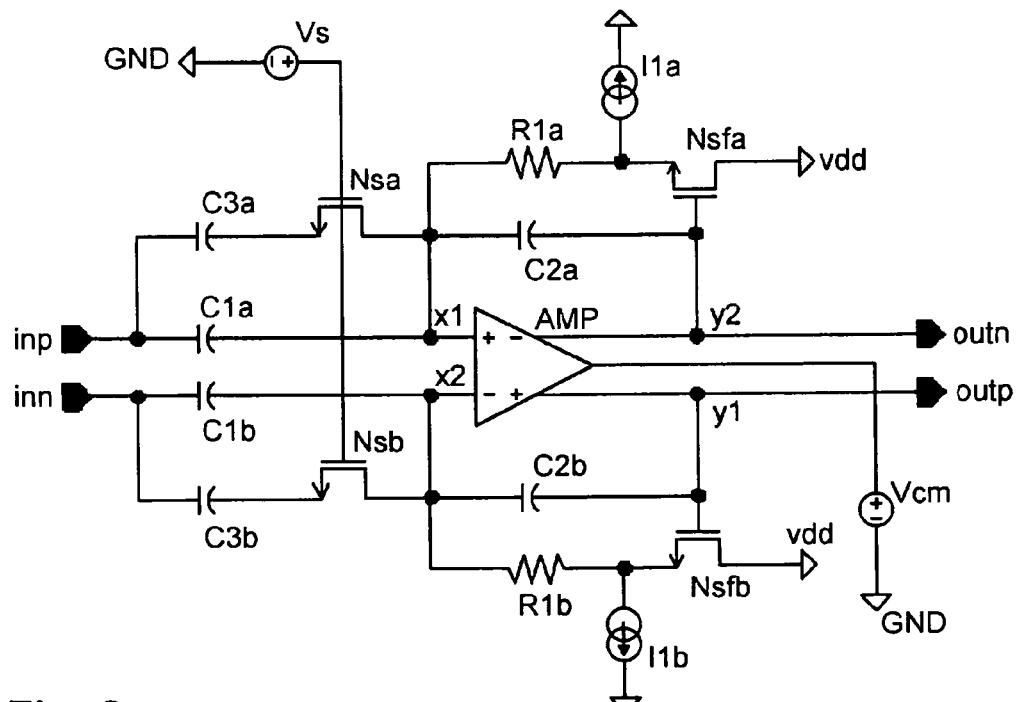
FIG. 2 is a circuit diagram of an amplifier according to the present invention.

FIG. 2 shows a circuit configuration whose function essentially corresponds to the function of the amplifier configuration described with reference to FIG. 1. In particular, the input signal guided via coupling paths to the input of an amplifier AMP is again provided as an output signal, amplified by a circuit amplification, the circuit amplification being defined practically exclusively by the capacitances of capacitors C1a, C1b, C2a, C2b (and possibly C3a, C3b).

The modification from the embodiment shown in FIG. 1 is that a combination made of a coupling resistor R1b and a transistor Nsfb acting as a level shifter, which connects the positive amplifier output or the circuit node y1 to the inverting amplifier input or circuit node x2, is situated and a combination made of a coupling resistor R1a and a transistor Nsfa acting as a level shifter is situated between the negative amplifier output or the node y2 and the noninverting amplifier input x1.

The drain terminals of these level shifter transistors Nsfa, Nsfb are connected in the exemplary embodiment shown to the second supply potential vdd, the gate terminals of these transistors are each connected to one of the circuit nodes y1, y2, and the source terminals are connected to one of two constant current sources I1a, I1b in addition to the particular coupling resistor. The constant current sources I1a, I1b apply a constant current flow via the channel of the transistors to the transistors Nsfa, Nsfb. As a function of the concrete properties of the transistors Nsfa, Nsfb, the applied currents result in corresponding gate-source voltages at these transistors, which in turn cause a corresponding level shift of the input CM in relation to the output CM.

Possibilities for implementing the current sources I1a, I1b are well-known to those skilled in the art and therefore do not require any more detailed explanation here. In the simplest case, a current source may be formed by an FET operated in saturation, for example.

The capacitance inevitably existing between source and gate of the transistors Nsfa, Nsfb is significantly smaller (e.g. by a factor greater than 100 or even greater than 1000) than the actual feedback capacitance (C2a or C2b) and thus may be neglected in regard to the feedback characteristic.

In the exemplary embodiment shown, the input CM is somewhat closer to the first supply potential GND than the output CM. In the circuit configuration shown, two advantages are thus achieved.

Firstly, potentials which are especially favorable for the perfect operation of the operational amplifier AMP exist at the input-side circuit nodes x1, x2.

In addition, the potentials existing at the source terminals of the switching transistors Nsa, Nsb (in relation to GND) are so low that these transistors may be switched on without problems, i.e., have a very low resistance in the switched-on state.

The switching transistors Nsa, Nsb may advantageously be implemented, for example, as MOS switches having thick-oxide variants, which require comparatively high voltages for supplying the MOS gates. Without the level shifting of the input CM in relation to the output CM provided in the circuit configuration according to the present invention, separate (larger) supply potentials must be provided for such switching transistors or a predefined supply potential must be multiplied, which would represent a significant outlay either inside or outside (e.g., circuit board level) the integrated circuit.

It is noteworthy that any manufacturing tolerances or variations of the gate-source voltage at the level shifter transistors Nsfa, Nsfb and thus the extent of the level shifting may be largely compensated for by a variation (caused in the same manufacturing process) of the characteristic of the switching transistors Nsa, Nsb. Manufacturing tolerances thus do not result in a variation of the intrinsic resistance of the switching transistors Nsa, Nsb.

In a refinement of the circuit configuration described, the setting voltage Vcm input to the operational amplifier AMP to set the output CM is not generated as a fraction of the supply voltage but rather as a constant voltage with reference to vdd (or GND). In other words, in this refinement, the voltage Vcm is provided as the supply voltage reduced by a predetermined reduction voltage. The reduction voltage is selected for this purpose so that Vcm corresponds to half of the supply voltage (as specified). With this refinement, the influence of a variation of the supply voltage or the supply potential vdd possibly resulting in operation of the circuit configuration on the variation of the gate-source voltage of the transistors Nsa, Nsb and thus on the variation of the intrinsic resistance is drastically reduced.

The invention claimed is:

1. A circuit configuration having a circuit input (inp, inn) for an input signal to be amplified and a circuit output (outn, outp) for outputting the amplified input signal as an output signal,
the circuit configuration having a operational amplifier (AMP) implemented as fully-differential, having a noninverting amplifier input (x1), an inverting amplifier input (x2), a positive amplifier output (y1) and a negative amplifier output (y2),
the circuit input (inp, inn) being connected via coupling paths to the amplifier inputs (x1, x2) and the amplifier outputs (y1, y2) being connected via decoupling paths to the circuit output (outp, outn) and via feedback paths to the amplifier inputs (x2, x1),
characterized by a combination made of a coupling resistor (R1b) and a level shifter (I1b, Nsfb) connecting the positive amplifier output (y1) to the inverting amplifier input (x2) and a combination made of a coupling resistor (R1a) and a level shifter (I1a, Nsfa) connecting the negative amplifier output (y2) to the noninverting amplifier input (x1).

2. The circuit configuration according to claim 1, wherein at least a part of the coupling paths are formed by impedances having a capacitive component.

3. The circuit configuration according to claim 1, wherein at least a part of the feedback paths are formed by impedances having a capacitive component.

4. The circuit configuration according to claim 1, wherein the coupling resistors (R1a, R1b) are each implemented as an ohmic resistor having a resistance value of more than 1 MΩ.

5. The circuit configuration according to claim 1, wherein the two level shifters (I1a, Nsfa, I1b, Nsfb) each comprise a transistor (Nsfa, Nsfb) powered using a constant current source (I1a, I1b).

6. The circuit configuration according to claim 5, wherein the transistor (Nsfa, Nsfb) is an FET.

7. The circuit configuration according to claim 1, wherein the two level shifters (I1a, Nsfa, I1b, Nsfb) are constructed identically.

8. The circuit configuration according to claim 1, wherein the operational amplifier (AMP) has a setting input for setting the output common mode voltage (Vcm).

9. The circuit configuration according to claim 1, wherein the operational amplifier (AMP) is connected to a first supply potential (GND) and a second supply potential (vdd) for its supply and the output common mode voltage (Vcm) is set as a predetermined fraction of the supply voltage (vdd-GND).

10. The circuit configuration according to claim 9, wherein the fraction is in the range from 40% to 60%.

11. The circuit configuration according to claim 1, wherein the operational amplifier (AMP) is connected to a first supply potential (GND) and a second supply potential (vdd) for its supply and the output common mode voltage (Vcm) is set as the supply voltage (vdd-GND) reduced by a predetermined reduction voltage.

12. The circuit configuration according to claim 11, wherein the reduction voltage is in the range from 40 to 60% of a rated supply voltage (vdd-GND) of the operational amplifier (AMP).

13. The circuit configuration according to claim 1, wherein the coupling paths for changing a circuit amplification each comprise impedances (C3a, C3b) which are each connectable and disconnectable via a transistor (Nsa, Nsb).

* * * * *